United States Patent [19]

Tsukune et al.

[11] Patent Number: 5,041,311
[45] Date of Patent: Aug. 20, 1991

[54] CHEMICAL VAPOR DEPOSITION METHOD USING A PLASMA SELF-CLEANING

[75] Inventors: Atsuhiro Tsukune, Kawasaki; Kenji Koyama, Kuwana, both of Japan

[73] Assignee: Fujitsu Limited, Kawasaki, Japan

[21] Appl. No.: 490,887

[22] Filed: Mar. 9, 1990

[51] Int. Cl.$^5$ .................. C23C 16/02; B05D 3/06
[52] U.S. Cl. .................. 427/255.3; 427/309; 427/307; 427/255.2; 427/255.1; 427/255; 427/248.1; 156/643; 156/646
[58] Field of Search .................. 427/255.3, 39, 309, 427/307, 248.1, 255, 255.1, 255.2, 255.7; 156/643, 646; 437/228

[56] References Cited

U.S. PATENT DOCUMENTS

| | | | |
|---|---|---|---|
| 4,058,638 | 11/1977 | Morton | 427/39 |
| 4,579,609 | 4/1986 | Reit et al. | 148/175 |
| 4,629,635 | 12/1986 | Brors | 427/255.2 |

FOREIGN PATENT DOCUMENTS 0296891 12/1988 European Pat. Off. .

OTHER PUBLICATIONS

European Search Report.

Primary Examiner—Norman Morgenstern
Assistant Examiner—Roy V. King
Attorney, Agent, or Firm—Armstrong, Nikaido, Marmelstein, Kubovcik & Murray

[57] ABSTRACT

A CVD method comprises the steps of making a plasma self-cleaning within a chamber using a gas which includes fluorine, coating an inside of the chamber by a first layer of a material which includes silicon and nitrogen, and forming a second layer on a predetermined surface within the chamber by a chemical vapor deposition. The second layer is made of a material which includes a quantity of nitrogen smaller than a quantity of nitrogen included in the first layer.

4 Claims, 7 Drawing Sheets

CHEMICAL VAPOR DEPOSITION METHOD USING A PLASMA SELF-CLEANING

BACKGROUND OF THE INVENTION

The present invention generally relates to chemical vapor deposition methods, and more particularly to a chemical vapor deposition method which is employed in a chemical vapor deposition apparatus of a type which makes a plasma self-cleaning using a gas which includes fluorine.

Recently, a high throughput is required of a chemical vapor deposition (CVD) apparatus. For this reason, a plasma self-cleaning is used within a chamber of the CVD apparatus so as to minimize the down time of the CVD apparatus.

In the conventional CVD apparatus, the plasma self-cleaning is made by use of a gas which includes fluorine. Thereafter, prior to forming a CVD layer on a wafer, the inside of the chamber is coated with a material identical to that of the CVD layer to a thickness of several microns so as to suppress the effects of the fluorine gas remaining within the chamber after the plasma self-cleaning.

However, in the case where the CVD layer is a $SiO_2$ layer or a phospho-silicate glass (PSG) layer, it is impossible to eliminate or sufficiently suppress the gas which includes $CF_4$, $SF_6$, $NF_3$ and the like and is used for the plasma self-cleaning. For this reason, fluorine is inevitably mixed within the $SiO_2$ or PSG layer which is formed on the wafer.

A description will be given of an example of a case where a $SiO_2$ layer is formed on a Si wafer by the CVD. First, a plasma self-cleaning is carried out using a $NF_3$ gas. Thereafter, prior to forming the $SiO_2$ layer on the Si wafer, a $SiO_2$ layer is coated to a thickness of 3 microns inside the chamber of the CVD apparatus. Then, the $SiO_2$ layer is formed on the Si wafer by the CVD.

Figure 1:
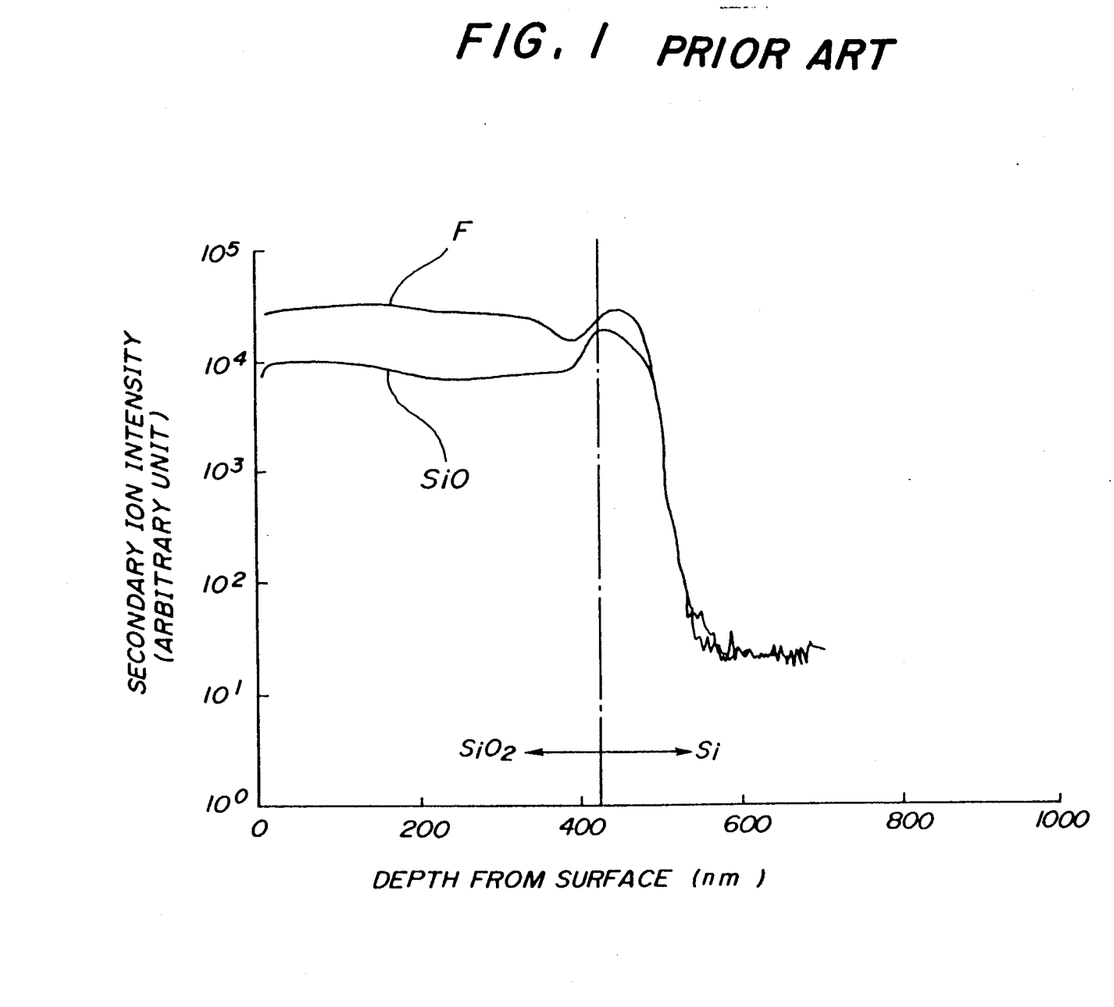
FIG. 1 is shows an analysis result of a SIMS which is made with respect to a $SiO_2$ layer which is formed by a conventional CVD method.

FIG. 1 shows an analysis result of a secondary ion mass spectrometry (SIMS) which is made with respect to the $SiO_2$ layer which is formed on the Si wafer by the CVD. As may be seen from FIG. 1, fluorine of a high concentration is mixed into the $SiO_2$ layer.

Therefore, according to the conventional CVD method, there are problems in that fluorine mixes into the $SiO_2$ layer, PSG layer and the like which are formed on the wafer by the CVD and the quality of the layer deteriorates.

SUMMARY OF THE INVENTION

Accordingly, it is a general object of the present invention to provide a novel and useful CVD method in which the problems described above are eliminated.

Another and more specific object of the present invention is to provide a CVD method comprising the steps of making a plasma self-cleaning within a chamber using a gas which includes fluorine, coating an inside of the chamber by a first layer of a material which includes silicon and nitrogen, and forming a second layer on a predetermined surface within the chamber by a chemical vapor deposition, where the second layer is made of a material other than nitrogen. According to the CVD method of the present invention, the inside of the chamber is coated by the first layer so as to positively eliminate or suppress the fluorine gas remaining within the chamber after the plasma self-cleaning. For this reason, the amount of fluorine mixed into the second layer is substantially suppressed compared to the conventional CVD method. The impurity quantity within the second layer is extremely small, and the second layer is uniform.

Other objects and further features of the present invention will be apparent from the following detailed description when read in conjunction with the accompanying drawings.

DESCRIPTION OF THE PREFERRED EMBODIMENTS

Figure 2:
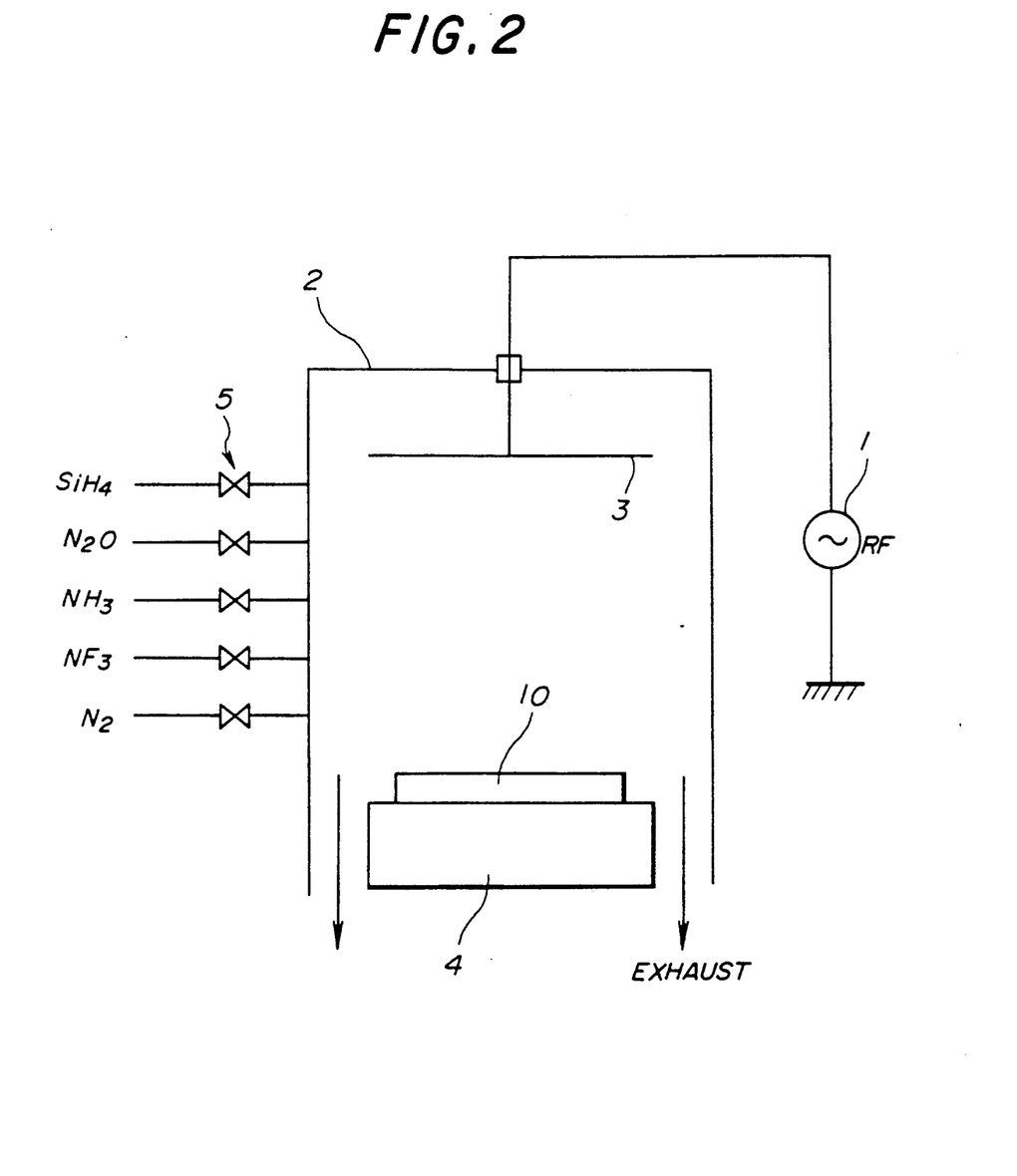
FIG. 2 is a diagram generally showing a plasma CVD apparatus which is used to carry out a CVD method according to the present invention.

FIG. 2 generally shows a plasma CVD apparatus which is used to carry out a CVD method according to the present invention. For the sake of convenience, it is assumed that a $SiO_2$ layer is formed on a Si wafer by use of the plasma CVD apparatus shown in FIG. 2 in a first embodiment of the CVD method according to the present invention. The plasma CVD apparatus generally comprises an RF source 1, a chamber 2, an RF electrode 3, a stage 4, and a valve group 5. A Si wafer 10 is placed on the stage 4 within the chamber 2.

First, a plasma self-cleaning is made as follows. That is, a pressure within the chamber 2 is set to 0.5 Torr, and a $NF_3$ gas is supplied at a flow rate of 100 cc/min. The RF source 1 operates at an RF of 13.56 MHZ and 300 W.

Second, the pressure within the chamber 2 is set to 1 Torr, and a $SiH_4$ gas is supplied at a flow rate of 20 cc/min, a $NH_3$ gas is supplied at a flow rate of 100 cc/min and a $N_2$ gas is supplied at a flow rate of 200 cc/min. The RF source 1 operates at an RF of 13.56 MHZ and 300 W. As a result, a plasma SiN layer coats the inside of the chamber 2 with a thickness of 0.3 micron.

Third, the Si wafer 10 is placed on the stage 4 within the chamber 2, and the pressure within the chamber 2 is set to 1 Torr. The wafer temperature is set to 400° C. In addition, a $SiH_4$ gas is supplied at a flow rate of 5 cc/min, a $N_2O$ gas is supplied at a flow rate of 250 cc/min and a $N_2$ gas is supplied at a flow rate of 50 cc/min. The RF source 1 operates at an RF of 13.56 MHZ and 300 W. As a result, a $SiO_2$ layer having a thickness of 1 micron is formed on the Si wafer 10.

Figure 3:
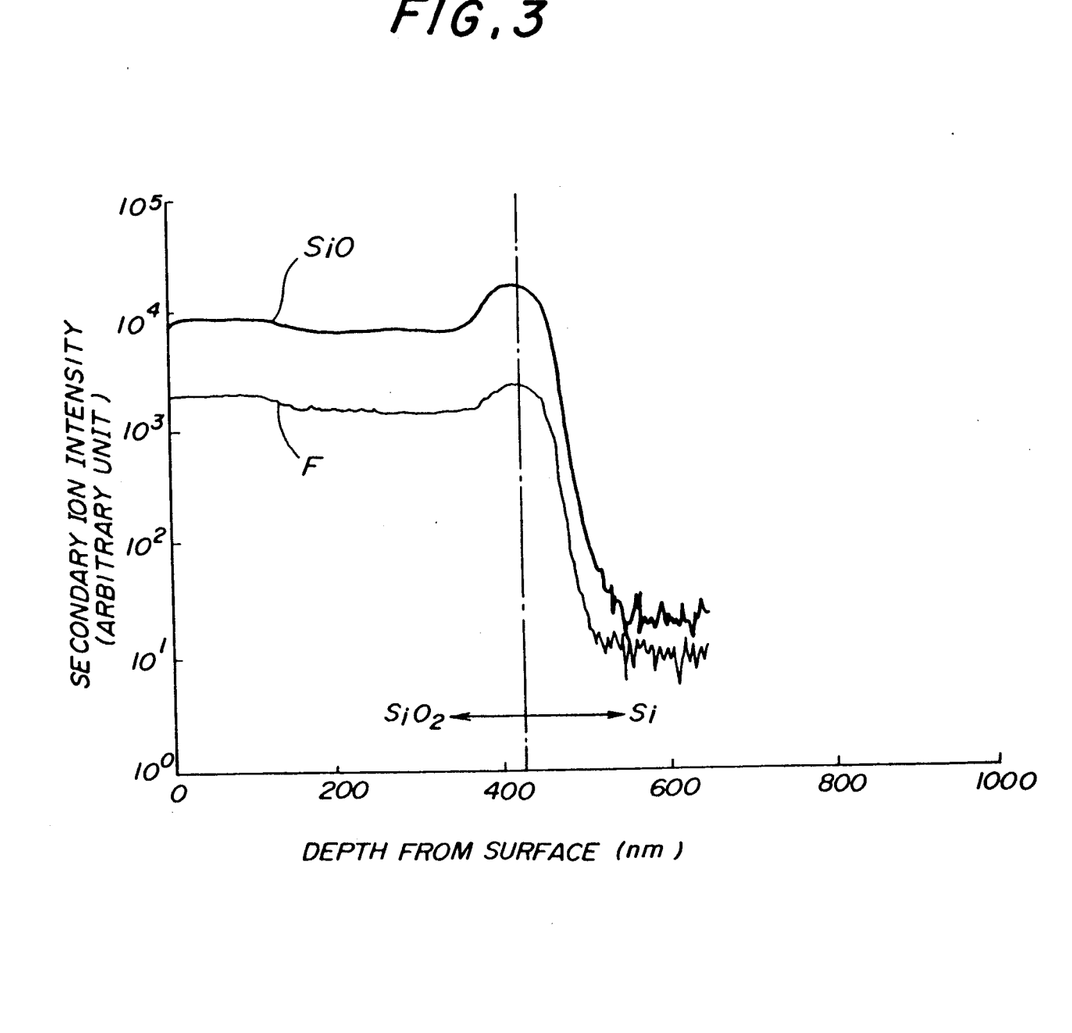
FIG. 3 shows an analysis result of SIMS which is made with respect to a $SiO_2$ layer which is formed by a second embodiment of the CVD method according to the present invention.

FIG. 3 shows an analysis result of a SIMS which is made with respect to the $SiO_2$ layer which is formed on the Si wafer 10 by this embodiment. It can be seen from a comparison of FIGS. 3 and 1 that in this embodiment the amount of fluorine mixed into the $SiO_2$ layer which is formed on the Si wafer 10 is extremely small compared to that of the conventional case.

Next, a description will be given of a second embodiment of the CVD method according to the present invention. In this embodiment, a PSG layer is formed on the Si wafer by use of the plasma CVD apparatus shown in FIG. 2.

First, a plasma self-cleaning is made for 80 seconds under the following conditions. That is, a pressure within the chamber 2 is set to approximately 0.5 Torr, and a $NF_3$ gas is supplied at a flow rate of 300 SCCM and $N_2O$ gas is supplied at a flow rate of 150 SCCM. The RF source 1 operates at an RF of 13.56 MHz and 500 W. The temperature within the chamber 2 is set to 350° C.

Second, a SiN layer is coated inside the chamber 2 for 15 seconds under the following conditions. That is, the pressure within the chamber 2 is set to 3 Torr, and a $SiH_4$ gas is supplied at a flow rate of 130 SCCM, a $NH_3$ gas is supplied at a flow rate of 60 SCCM and a $N_2$ gas is supplied at a flow rate of 500 SCCM. The RF source 1 operates at an RF of 13.56 MHz and 350 W. The temperature within the chamber 2 is set to 350° C. As a result, the plasma SiN layer coats the inside of the chamber 2 with a thickness of approximately 1500° Å.

Third, the Si wafer 10 is placed on the stage 4 within the chamber 2, and the pressure within the chamber 2 is set to 3 Torr. The wafer temperature is set to 350° C. In addition, a $SiH_4$ gas is supplied at a flow rate of 50 SCCM, a $N_2O$ gas is supplied at a flow rate of 1300 SCCM and a gas which includes 1% of $PH_3$ gas within an Ar gas is supplied at a flow rate of 800 SCCM. The RF source 1 operates at an RF of 13.56 MHz and 100 W. This process is carried out for 15 seconds. As a result, a PSG layer having a thickness of approximately 2000 Å is formed on the Si wafer 10.

Figure 4:
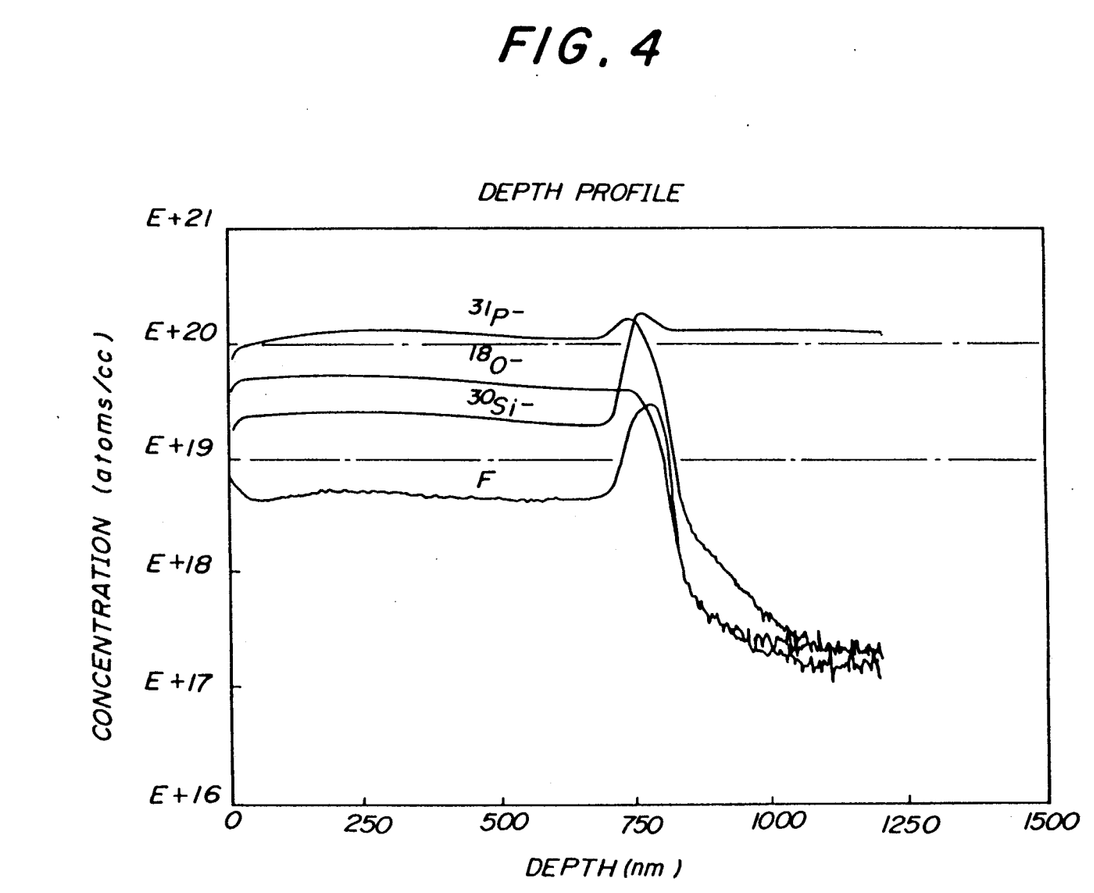
FIG. 4 shows an analysis result of SIMS which is made with respect to a PSG layer which is formed by a second embodiment of the CVD method according to the present invention.

FIG. 4 shows an analysis result of a SIMS which is made with respect to the PSG layer which is formed on the Si wafer 10 by this embodiment. It can be seen from FIG. 3 that the amount of fluorine mixed into the PSG layer which is formed on the Si wafer 10 is extremely small.

Figure 5:
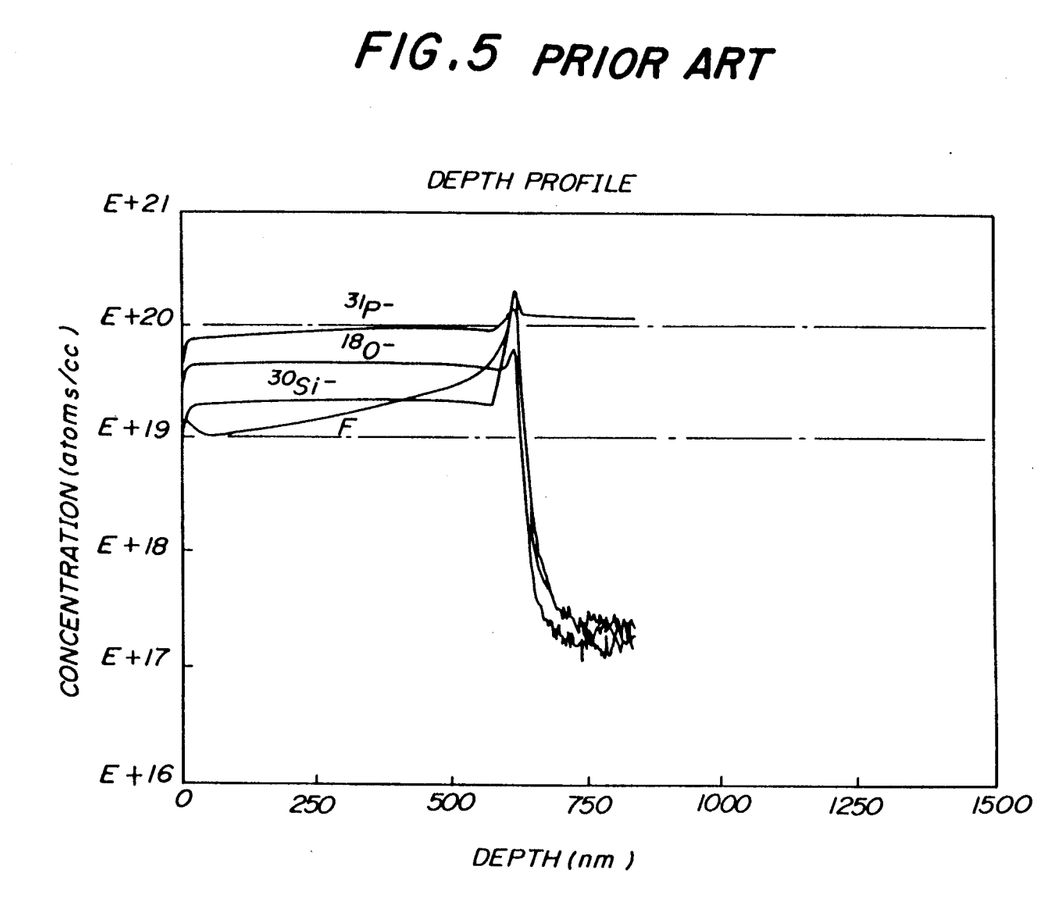
FIGS. 5 through 7 show analysis results of SIMS which is made with respect to a PSG layer which is formed by a conventional CVD method.
Figure 6:
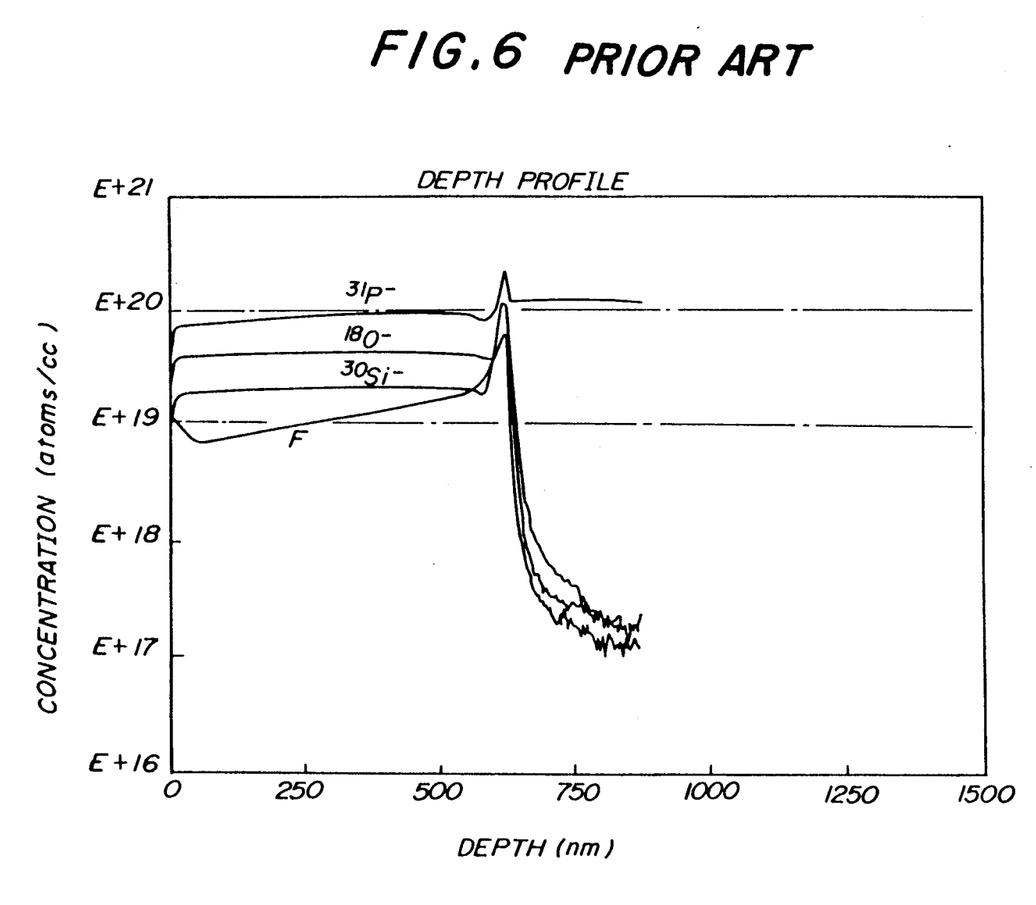
Figure 7:
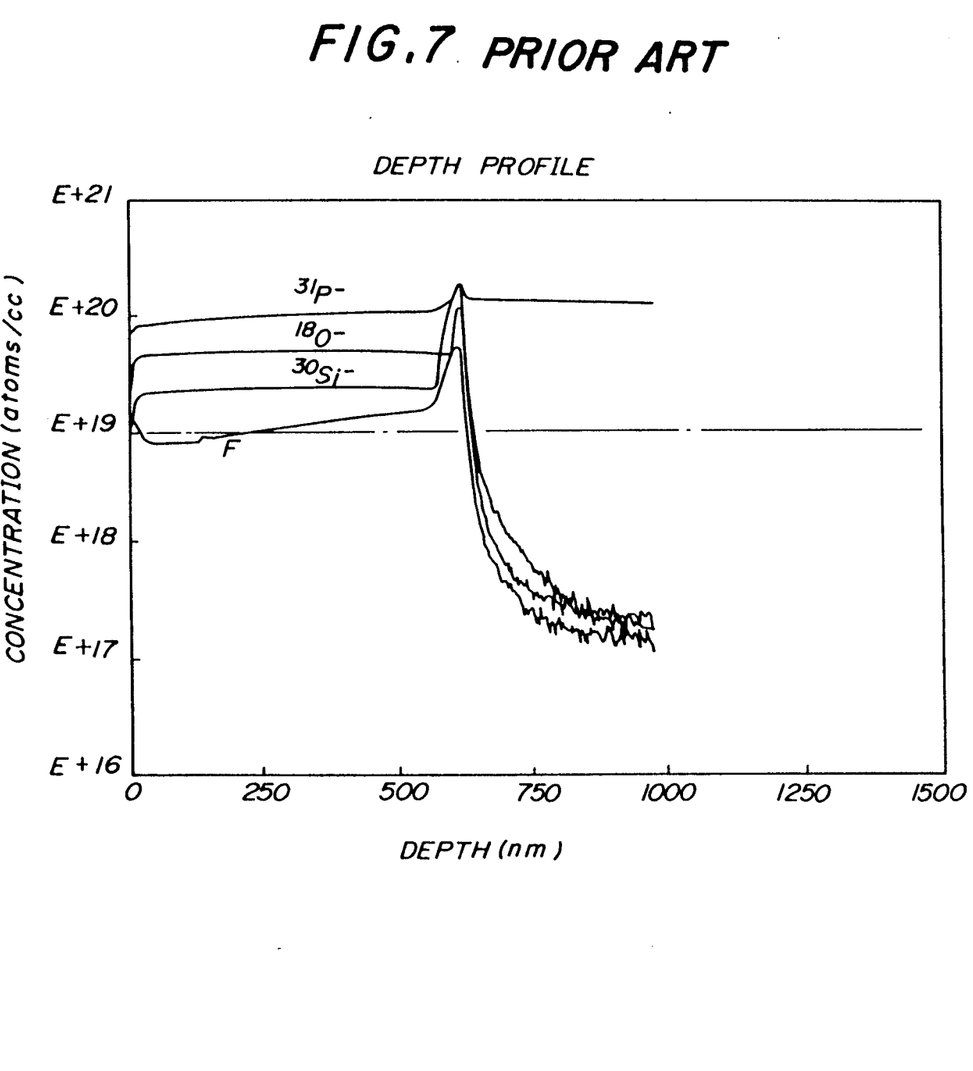

For comparison purposes, FIGS. 5 through 7 show analysis results of SIMS which is made with respect to a PSG layer which is formed by a conventional CVD method. According to the conventional CVD method, it is assumed that a plasma self-cleaning and the forming of the PSG layer on the Si wafer are made under the same conditions as those of the second embodiment. But according to the conventional CVD method, a PSG layer coats the inside of the chamber after the plasma self-cleaning and prior to the forming of the PSG layer on the Si wafer. The PSG layer coats the inside of the chamber under the following conditions. That is, the pressure within the chamber is set to 3 Torr. The wafer temperature is set to 350° C. In addition, a $SiH_4$ gas is supplied at a flow rate of 40 SCCM, a $N_2O$ gas is supplied at a flow rate of 1300 SCCM and a $PH_3$ gas is supplied at a flow rate of 800 SCCM. The RF source operates at an RF of 13.56 MHz and 100 W. This process is carried out for 15 seconds, 30 seconds and 60 seconds.

FIGS. 5, 6 and 7 respectively show analysis results of SIMS which is made with respect to the PSG layer which is formed by the conventional CVD method for the three cases where the process of forming the PSG layer within the chamber is carried out for 15 seconds, 30 seconds and 60 seconds. It can be seen from FIGS. 5 through 7 that the amount of fluorine mixed into the PSG layer which is formed on the Si wafer is relatively large regardless of the length of the process of forming the PSG layer within the chamber. But as may be seen by comparing FIG. 4 with FIGS. 5 through 7, the amount of fluorine mixed into the PSG layer which is formed on the Si wafer 10 according to the second embodiment is extremely small compared to the conventional case.

The effect of reducing the amount of fluorine mixed into the layer which is formed on the wafer by the CVD method is notable when the inside of the chamber is coated with a layer which includes silicon (Si) and nitrogen (N) to a thickness of at least 1000 Å.

In addition, the layer which coats the inside of chamber may be selected from a group of materials including SiN, SiON and SiBN.

Further, the present invention is not limited to these embodiments, but various variations may be made without departing from the scope of the present invention.

What is claimed is:

1. A chemical vapor deposition method comprising the steps of:
   self-cleaning the inside of a chemical vapor deposition chamber with a plasma produced from a flourine-containing gas
   coating the inside of the chemical vapor deposition chamber with a first layer which is made of a material selected from the group consisting of SiN, SiON and SiBN, said first layer being coated to at least 1000 Å;
   placing a substrate within the chemical vapor deposition chamber; and
   forming a second layer on a predetermined surface of the substrate within the chemical vapor deposition chamber by a chemical vapor deposition, said second layer being made of an oxygen and silicon containing a material which includes substantially no nitrogen.

2. The chemical vapor deposition method as claimed in claim 1, wherein said step of making the plasma self-cleaning uses a $NF_3$ gas.

3. The chemical vapor deposition method as claimed in claim 1 wherein said second layer is made from a material selected from the group consisting of silicon dioxide ($SiO_2$) and phospho-silicate glass (PSG).

4. The chemical vapor deposition method as claimed in claim 3 wherein said predetermined surface is made of silicon (Si).

* * * * *

UNITED STATES PATENT AND TRADEMARK OFFICE
CERTIFICATE OF CORRECTION

PATENT NO. : 5,041,311

DATED : August 20, 1991

INVENTOR(S) : Atsuhiro TSUKUNE et al

It is certified that error appears in the above-identified patent and that said Letters Patent is hereby corrected as shown below:

On the cover page, after Item [22], the following should appear:

-- [30]     Foreign Application Priority Data
    March 14, 1989    [JP]    Japan . . . . . .    1-61508 --.

Signed and Sealed this

Twelfth Day of January, 1993

*Attest:*

DOUGLAS B. COMER

*Attesting Officer*    Acting Commissioner of Patents and Trademarks